US012813341B2

(12) United States Patent
Iyer et al.

(10) Patent No.: US 12,813,341 B2
(45) Date of Patent: Nov. 24, 2026

(54) MEMORY PACKAGING WITH INTEGRATED ACTIVE COOLING DEVICES AND RELATED METHODS

(71) Applicant: SMART Modular Technologies, Inc., Newark, CA (US)

(72) Inventors: Satyanarayan Iyer, Fremont, CA (US); Torry Steed, Poway, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 419 days.

(21) Appl. No.: 18/383,108

(22) Filed: Oct. 24, 2023

(65) Prior Publication Data

US 2025/0132290 A1 Apr. 24, 2025

(51) Int. Cl.

| | |
|---|---|
| ***H01L 25/065*** | (2023.01) |
| ***H01L 23/31*** | (2006.01) |
| ***H01L 23/498*** | (2006.01) |
| ***H10B 80/00*** | (2026.01) |
| ***H10W 70/685*** | (2026.01) |

(Continued)

(52) U.S. Cl.

CPC ............ *H10W 90/00* (2026.01); *H10B 80/00* (2023.02); *H10W 70/685* (2026.01); *H10W 74/124* (2026.01); *H10W 90/288* (2026.01)

(58) Field of Classification Search

CPC . H10W 90/00; H10W 70/685; H10W 74/124; H10W 90/288; H10B 80/00; H01L 23/315; H01L 25/0652; H01L 25/18; H01L 2225/06589; H01L 23/49822

See application file for complete search history.

(56) References Cited

U.S. PATENT DOCUMENTS 6,424,533 B1 * 7/2002 Chu ........................ H10N 10/17 361/719
7,436,059 B1 * 10/2008 Ouyang ................. H10N 10/13 257/713

(Continued)

FOREIGN PATENT DOCUMENTS

KR 20150146365 A * 12/2015

OTHER PUBLICATIONS

Im, Se Rang; Kang, Myung Sam; Chung, Yul Kyo; Lee, Seung Eun, "Substrate Having an Thermoelectric Module and Semiconductor Package Using the Same", Dec. 23, 2015, Samsung Electro Mech, Entire Document (Translation of KR 20150146365). (Year: 2015).*

*Primary Examiner* — Stephen S Sul
(74) *Attorney, Agent, or Firm* — Withrow & Terranova, P.L.L.C.

(57) ABSTRACT

Memory packages are employed in computer processing systems to house memory chips that store data for a processing circuit. The memory chips consume power each time they are accessed, which may be thousands of times per second, which generates heat that needs to be dissipated to avoid high temperatures that may damage memory circuits in the memory chips. The memory packages may include at least one memory chip disposed on a substrate. The memory packages may also include an active cooling device disposed between the memory chips and a package surface to actively conduct heat from the memory chips to the package surface, where it may be dissipated. The active cooling device May be on an opposite side of the memory chips from the substrate or may be disposed in a cavity in the substrate.

9 Claims, 7 Drawing Sheets

(51) Int. Cl.

| | |
|---|---|
| ***H10W 74/10*** | (2026.01) |
| ***H10W 90/00*** | (2026.01) |
| *H10W 90/20* | (2026.01) |

(56) References Cited

U.S. PATENT DOCUMENTS

| | | | | |
|---|---|---|---|---|
| 11,169,583 | B2 * | 11/2021 | Karalnik | G06F 1/3287 |
| 2006/0156737 | A1 * | 7/2006 | Liu | F25B 21/02 257/E23.092 |
| 2011/0032679 | A1 * | 2/2011 | Baek | H05K 7/20472 361/715 |
| 2016/0334845 | A1 * | 11/2016 | Mittal | G06F 1/206 |
| 2022/0077023 | A1 * | 3/2022 | Subrahmanyam | H01L 23/38 |
| 2022/0165640 | A1 * | 5/2022 | Byun | H01L 23/38 |
| 2022/0418080 | A1 * | 12/2022 | Ma | H05K 1/0203 |
| 2024/0063087 | A1 * | 2/2024 | Kuo | H10N 10/01 |
| 2024/0111344 | A1 * | 4/2024 | Austin | G06F 1/20 |
| 2025/0056708 | A1 * | 2/2025 | Bolle | G02B 6/4271 |

* cited by examiner

MEMORY PACKAGING WITH INTEGRATED ACTIVE COOLING DEVICES AND RELATED METHODS

FIELD OF THE DISCLOSURE

The present disclosure relates to data storage devices that may be employed in computer processing systems.

BACKGROUND

Technologies for packaging the components of computer processing systems have evolved to provide more circuits and functionality in a smaller volume. These components include processors and logic circuits that can include many thousands of transistor circuits consuming power in every cycle of a system clock with thousands of cycles per second. Passive circuit devices also consume power through resistive losses. Such power consumption by so many electrical devices in a small volume causes heating of the component packaging that, if not properly managed, can raise the temperatures of components to levels where permanent damage to the circuits can occur. This problem is known to be acute in high-performance processor circuits, for which various methods have been developed to cool the components, including convective cooling devices (e.g., fans) and conductive cooling devices (e.g., heat sinks) provided on external component surfaces. However, computer processing systems may include a large number of high-speed memory circuits that also experience heating, which can reduce memory retention and increase overall power consumption.

SUMMARY

Aspects disclosed herein include memory packages with integrated active cooling devices. Related methods of integrating active cooling in memory packages are also disclosed. Memory packaging is employed in computer processing systems to house memory chips that store data for a processing circuit. The memory chips consume power each time they are accessed, which may be thousands of times per second, generating heat that needs to be dissipated to avoid high temperatures that may damage memory circuits in the memory chips. In an exemplary aspect, the memory packages disclosed herein include at least one memory chip disposed on a substrate. The memory packages also include an active cooling device disposed between the memory chips and a package surface to actively conduct heat from the memory chips to the package surface, where it may be dissipated. In some examples, the active cooling device is on an opposite side of the memory chips from the substrate. In some examples, the active cooling device may be disposed in a cavity in the substrate.

In this regard, in one aspect, an exemplary memory package is disclosed. The memory package includes a substrate and at least one memory chip disposed on the substrate. The memory package further includes an active cooling device disposed between the at least one memory chip and a first package surface and configured to actively conduct heat from the at least one memory chip to the first package surface.

In another aspect, a computer processing system is disclosed. The computer processing system includes a processor circuit configured to process data and a memory package. The memory package includes a substrate and at least one memory chip disposed on the substrate. The memory package further includes an active cooling device disposed between the at least one memory chip and a first package surface and configured to actively conduct heat from the at least one memory chip to the first package surface.

In another aspect, a method of fabricating a memory package is disclosed. The method includes forming a substrate and at least one memory chip disposed on the substrate. The method further includes disposing an active cooling device between the at least one memory chip and a first package surface, wherein the active cooling device is configured to actively conduct heat from the at least one memory chip to the first package surface.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 6A:
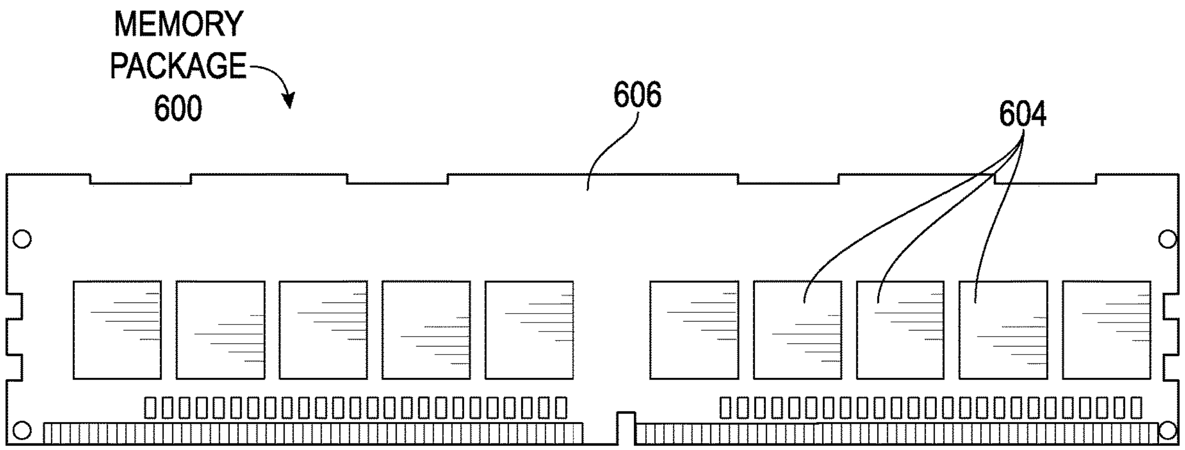
FIG. 6A is a plan view of a memory package comprising a memory card including memory devices disposed on a PCB, the memory device including memory chips that are cooled by at least one active cooling device.
Figure 6B:
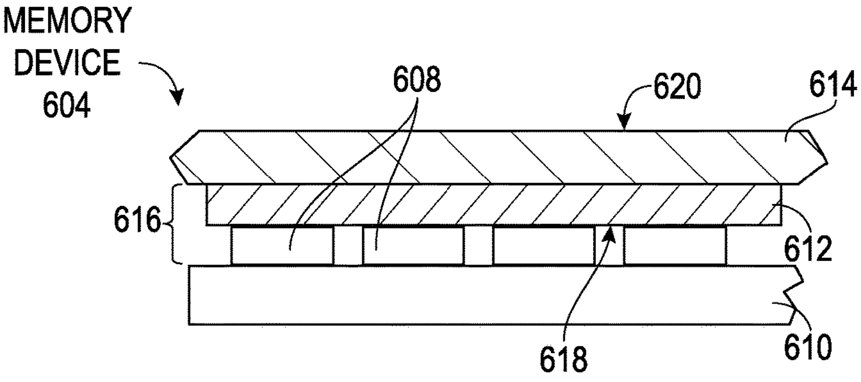
FIG. 6B is a cross-sectional side view of the memory package in FIG. 6A illustrating an active cooling device disposed in a memory device to cool memory chips.
Figure 6C:
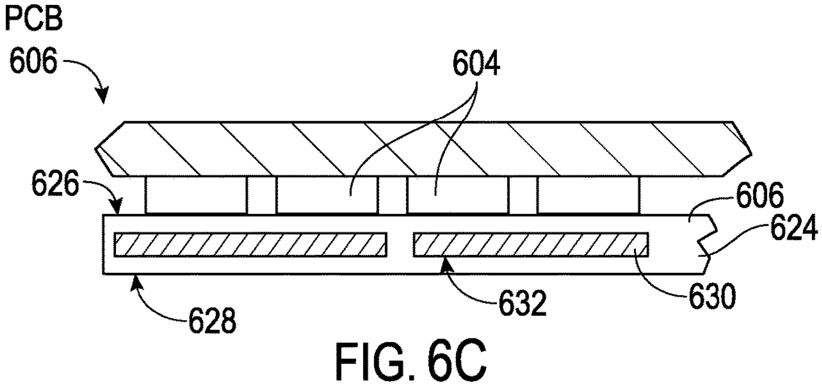
Figure 7:
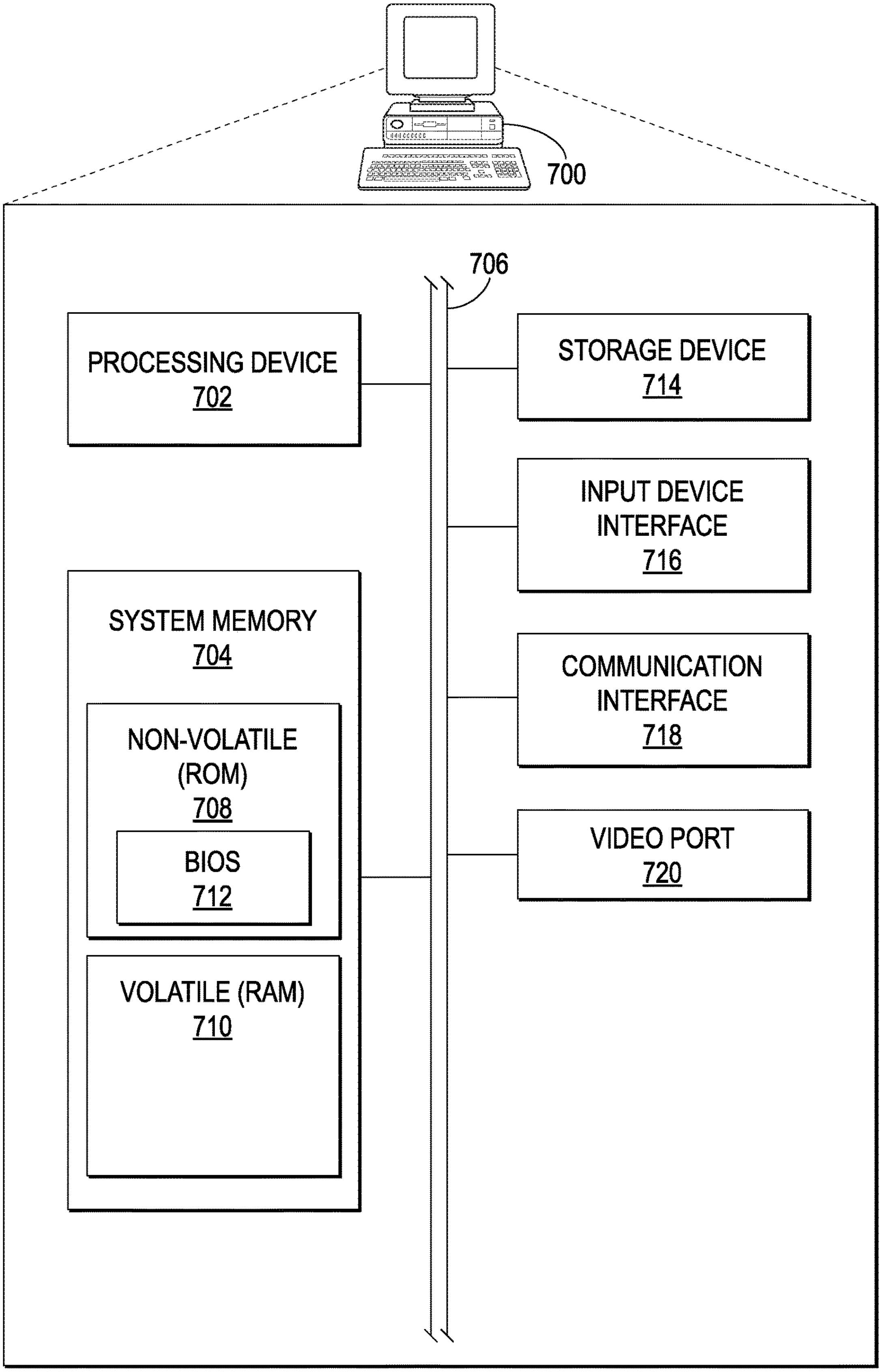

FIG. 6C is a cross-sectional side view of the memory package in FIG. 6A illustrating an active cooling device disposed in the PCB on which the memory device in FIG. 6B is mounted; and FIG. 7 is an illustration of a computer processing system including a processor and exemplary memory packages, including at least one memory chip disposed on a substrate and an active cooling device disposed between the memory chip and a package surface.

DETAILED DESCRIPTION

Aspects disclosed herein include memory packages with integrated active cooling devices. Related methods of integrating active cooling in memory packages is are also disclosed. Memory packaging is employed in computer processing systems to house memory chips that store data for a processing circuit. The memory chips consume power each time they are accessed, which may be thousands of times per second, generating heat that needs to be dissipated to avoid high temperatures that may damage memory circuits in the memory chips. In an exemplary aspect, the memory packages disclosed herein include at least one memory chip disposed on a substrate. The memory packages also include an active cooling device disposed between the memory chips and a package surface to actively conduct heat from the memory chips to the package surface, where it may be dissipated. In some examples, the active cooling device is on an opposite side of the memory chips from the substrate. In some examples, the active cooling device may be disposed in a cavity in the substrate.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic, and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Before exemplary memory packages 200, 300, 400, and 600, including active cooling devices, are described in detail with reference to FIGS. 3A, 3B, 4A, 4B, 5A-5C, and 6A-6C below, an example of an active cooling device 100 is first described with reference to FIG. 1.

Figure 1:
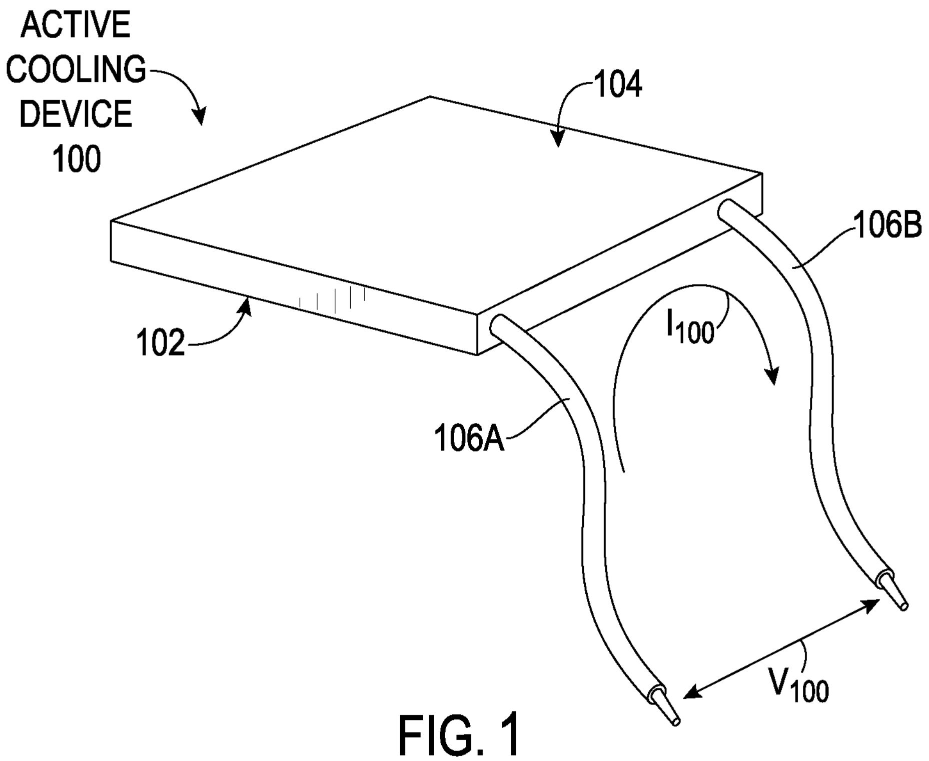
FIG. 1 is an illustration of one example of an active cooling device, in particular a thermoelectric device, also known as a Peltier cooling device.

FIG. 1 is an illustration of an active cooling device 100, and specifically a thermoelectric cooling device in this example. Thermoelectric cooling devices employ the Peltier effect in which heat is transferred from a first, cold surface 102 of a semiconductor device to a second, hot surface 104, opposite to the first surface 102, depending on a direction of a current in the device. A thermoelectric device may also be called a Peltier device or a solid-state heat pump. As the Peltier effect is well documented, further details of operation are not provided here.

The active cooling device 100 includes terminals 106A and 106B. A voltage $V_{100}$ applied to the terminals 106A and 106B causes a current $I_{100}$ to flow in the active cooling device 100. The current $I_{100}$ can move heat from the first surface 102 of the active cooling device 100 to the second surface 104. The amount of heat transferred may be directly related to the current $I_{100}$. In response to the current $I_{100}$, a temperature difference is created between the first surface 102 and the second surface 104 due to heat energy being moved from the first surface 102 to the second surface 104.

Thus, if the first surface 102 is positioned on or against a surface of another structure and thermally coupled to such structure, the surface of the structure may be cooled by conduction of heat from the first surface 102 to the second surface 104, where it may be dissipated by convection or other means. The first surface 102 may be referred to as the cold side of the active cooling device 100 and the second surface 104 may be referred to as the hot side.

Figure 2:
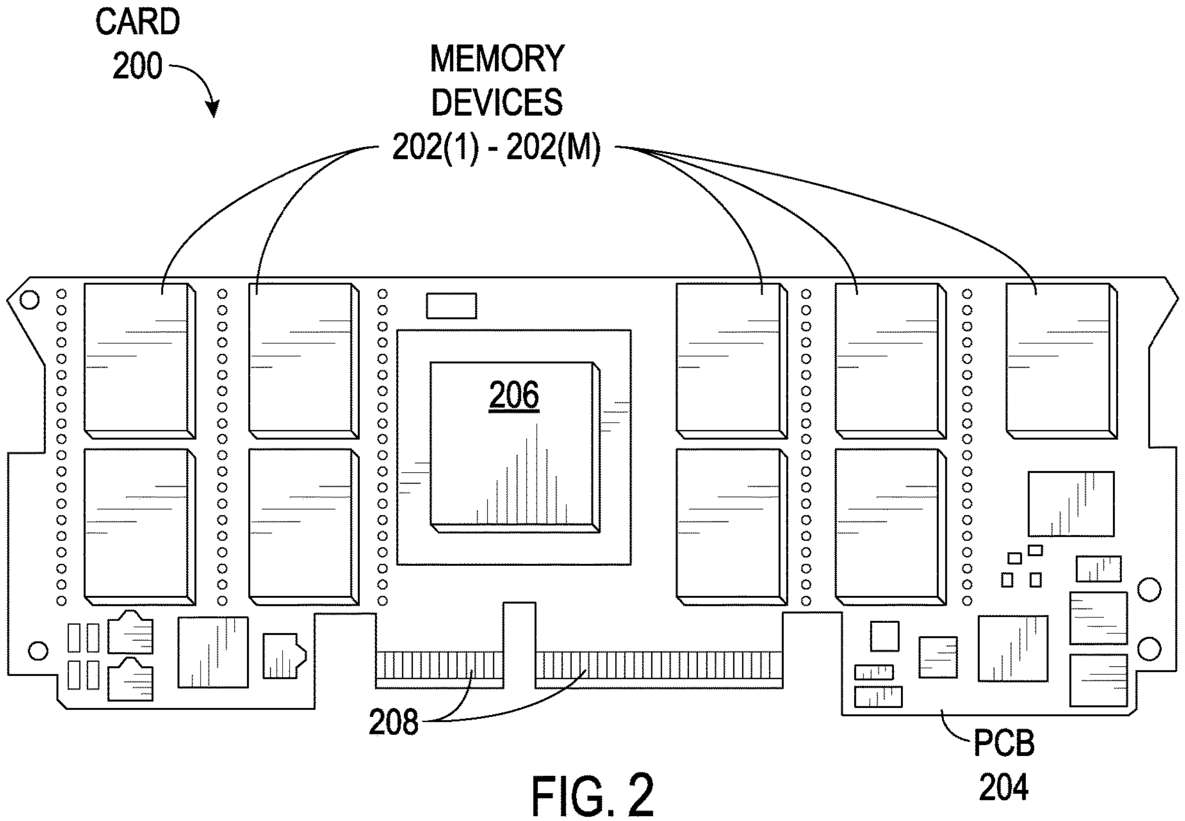
FIG. 2 is an illustration of an exemplary card for a computer processing system comprising a plurality of memory devices disposed on a printed circuit board (PCB) and cooled by an active cooling device.

FIG. 2 is an illustration of an exemplary card 200 of a computer processing system employing memory packaging with integrated active cooling devices. The card 200 includes a plurality of memory devices 202(1)-202(M) disposed on a printed circuit board (PCB) 204. In one example, the memory devices 202(1)-202(M) may comprise memory packaging with integrated active cooling devices, as shown more clearly in FIGS. 3A-3B. In another example, shown in detail in FIGS. 4A-4B, the PCB 204 comprises memory packaging with integrated active cooling devices.

The card 200 also includes a processor module 206 that accesses the memory devices 202(1)-202(M). A high-performance processor (not shown) contained in the processor module 206 may access the memory devices 202(1)-202(M) hundreds or thousands of times per second. Additionally, the card 200 includes an external interface 208 through which the memory devices 202(1)-202(M) may be accessed by an external circuit or system into which the card 200 is inserted. The memory devices 202(1)-202(M) consume energy each time they are accessed by the processor module 206 and also consume power during refresh operations and leakage currents during idle times. The consumption of power causes heating of the memory devices that must be dissipated at a sufficient rate to prevent the temperatures within the memory devices from exceeding a threshold temperature at which permanent damage may be caused to memory circuits therein. High temperatures can also increase memory access times, which can slow down or cause errors in the processor module 206. Circulating fans are employed in many computer processing systems to remove heated air and allow external surfaces of the card 200 to cool, but the rate at which heat is conducted from the heat-generating memory circuits in the memory device 202(1)-202(M) to external surfaces may be too slow to prevent overheating and damage, which becomes a greater problem as packages become smaller and operating frequencies increase. The card 200 provides one non-limiting example of a memory device disposed on a PCB or similar type of card or board in which an active cooling device may be integrated.

Figure 3A:
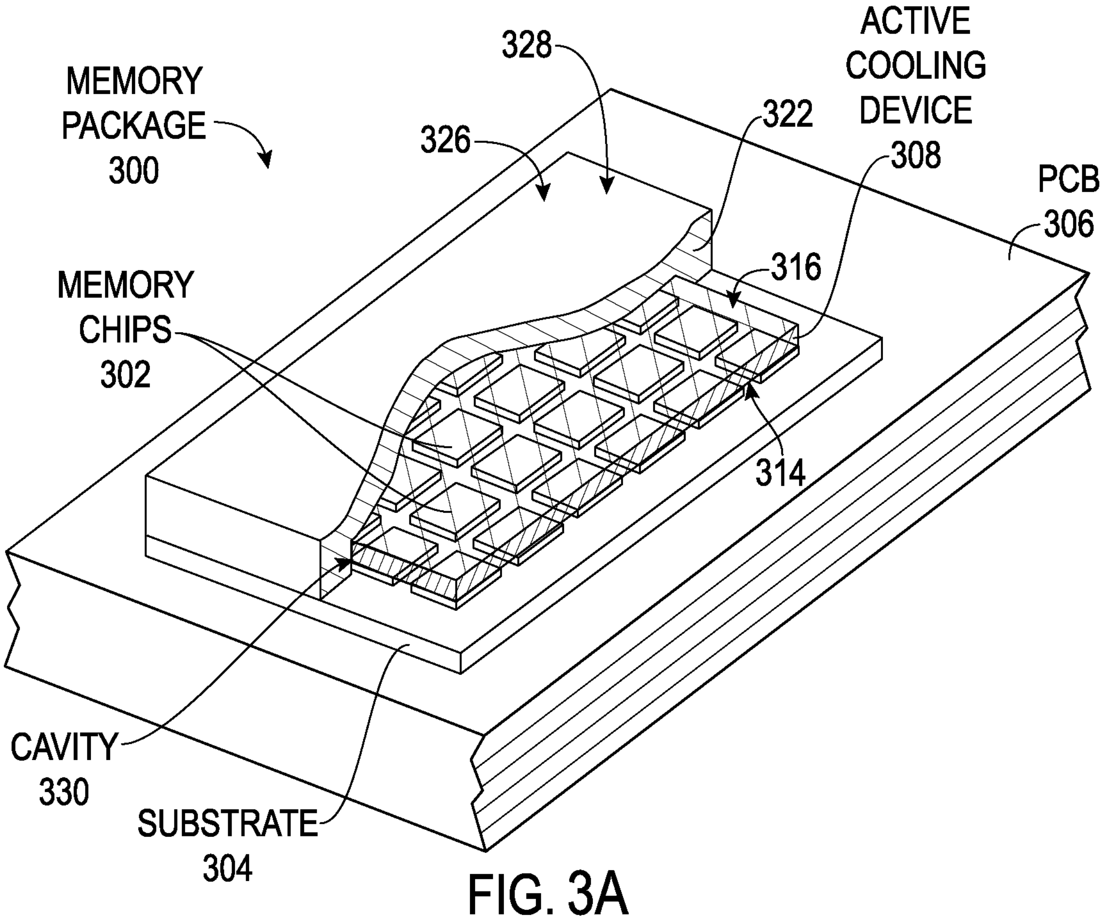
FIG. 3A is an isometric view of a memory device and the PCB in FIG. 2, showing a first example in which the active cooling device is disposed in the memory device.
Figure 3B:
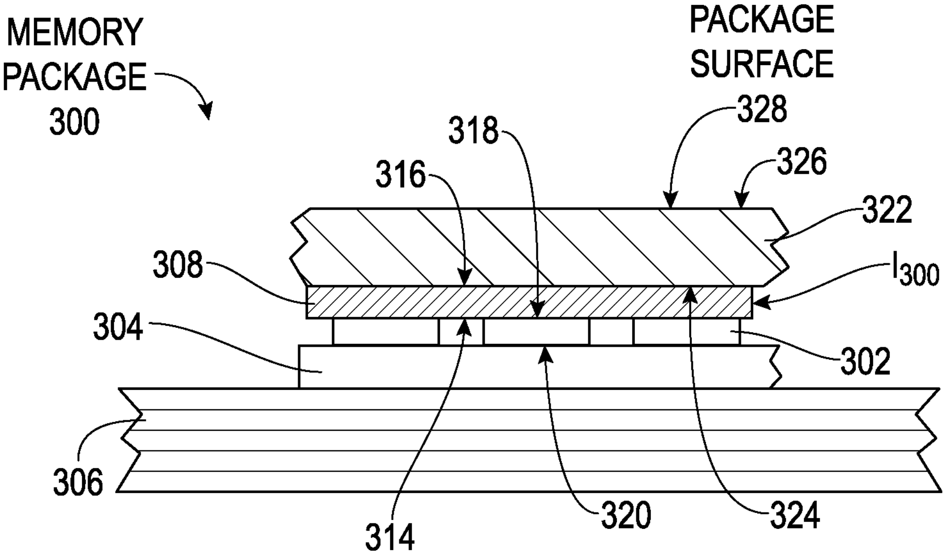
FIG. 3B is a cross-sectional side view of the memory device and PCB in the first example in FIG. 3A, showing the active cooling device disposed on the memory chips in the memory device.

FIGS. 3A and 3B are an isometric view and a cross-sectional side view, respectively, of an exemplary memory device 300, including memory chips 302 disposed on a substrate 304, and the substrate 304 is disposed on a first surface of a printed circuit board (PCB) 306. The memory device 300 is a first example referred to herein as a memory package 300, including an active cooling device 308. The memory device 300 may be any of the memory devices 202(1)-202(M) in FIG. 2 in a first example of the card 200 in FIG. 2 employing a memory package with an integrated active cooling device. The memory chips 302 may be disposed in a two-dimensional array on the substrate 304. The active cooling device 308 is integrated within the memory device 300 to improve the dissipation of heat generated in the memory chips 302. The memory chips 302 in the memory device 300 can be any type of memory chip, including non-volatile memory, including but not limited to static random access memory (RAM) (SRAM), dynamic RAM, ferromagnetic RAM (FeRAM), and NAND memory devices, for example. The memory device 300 may be a dynamic RAM (DRAM) package.

The memory chips 302 are configured to store data to be accessed by a processing circuit, such as the processor module 206 in FIG. 2. The substrate 304 includes first interconnects (e.g., wires) (not shown) that electrically couple to one or more of the memory chips 302 on the substrate 304. Some of the first interconnects extend through the substrate 304 to further couple the memory chips 302 to the PCB 306. The first interconnects may also extend laterally to connect the memory chips 302 to each other. Each of the memory chips 302 can store a portion of the data stored in the memory device 300 by the processor module 206 in FIG. 1. In this regard, the PCB 306 includes second interconnects (not shown) that couple to the memory device 300 and, in the example of the card 200 in FIG. 2, extend laterally to interconnect the memory devices 202(1)-202(M) to each other and to the processor module 206.

The active cooling device 308 in this example is a thermoelectric cooling device and may be the active cooling device 100 in FIG. 1. Thus, the active cooling device 308 is electrically coupled to at least one of the substrate 304 to receive power and is configured to actively conduct heat from a first device surface 314 disposed on the memory chips 302 to a second device surface 316. The first device surface 314 is thermally coupled to the memory chips 302. In this context, "actively conduct heat" refers to the transfer of heat energy in response to the flow of current based on the Peltier effect in the active cooling device 308. Active cooling may take place in response to a current $I_{300}$ through the active cooling device 308. The current $I_{300}$ may be controlled by an external circuit or by a circuit on the PCB 306, for example.

In FIG. 3B, the active cooling device 308 is disposed on a top side 318 of all of the memory chips 302 on the memory device 300, and the substrate 304 is on a bottom side 320 of the memory chips 302. The active cooling device 308 may be in direct contact with the memory chips 302, as shown, or may be in indirect contact having a thermally conductive material or element (not shown) between the active cooling device 308 and the memory chips 302, to improve thermal coupling. In some examples, rather than a single active cooling device 308 disposed on all the memory chips 302, the memory device 300 may include a second active cooling device or multiple active cooling devices, each disposed on one or more, but not all of, the memory chips 302.

The memory device 300 also includes an encapsulant layer 322 that is disposed on the active cooling device 308. The encapsulant layer 322 has an inner side 324 adjacent to and thermally coupled to the active cooling device(s) 308 and has an outer side 326, which is a package surface 328 of the memory device 300. Thus, the active cooling device 308 is disposed between at least one of the memory chips 302 and the package surface 328 of the encapsulant layer 322 and is configured to actively conduct heat from the memory chips 302 to the package surface 328.

The encapsulant layer 322 extends around the active cooling device 308 and the memory chips 302 to couple to the substrate 304, forming a cavity 330. The active cooling device 308 is enclosed in the cavity 330 between the encapsulant layer 322 and the substrate 304. The PCB 306 may be a laminated card (e.g., formed of an FR-4 material) and the substrate 304 of the memory device 300 is coupled to a surface 332 of the PCB 306.

Figure 4A:
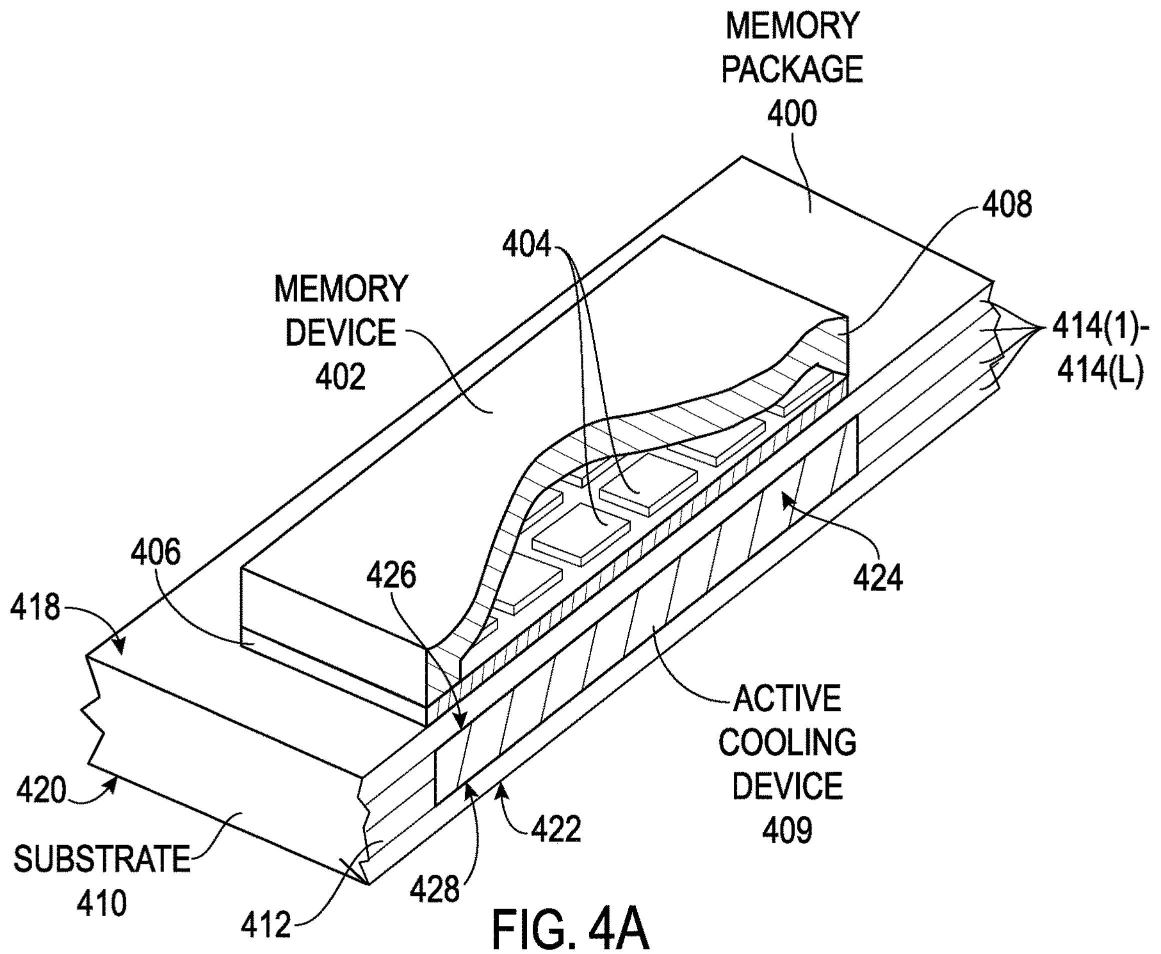
FIG. 4A is an isometric view of the memory device and the PCB in FIG. 2, showing a second example in which the active cooling device is disposed in the PCB adjacent to the memory device.
Figure 4B:
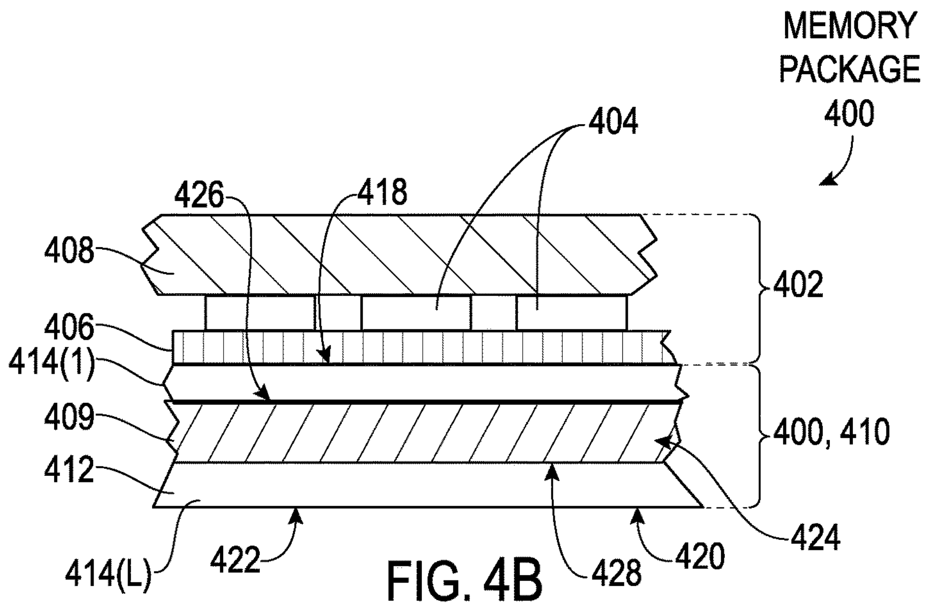
FIG. 4B is a cross-sectional side view of the memory device and PCB in the second example in FIG. 4A, showing the active cooling device disposed between a first surface and a second surface of the PCB.

FIGS. 4A and 4B are an isometric view and a cross-sectional view, respectively, of a PCB 400 and a memory device 402 in a second example of the card 200 in FIG. 2.

The PCB 400 is a second example referred to herein as a memory package 400, including an integrated active cooling device. The memory device 402 may be one of the plurality of memory devices 202(1)-202(M) in FIG. 2. In this example, the memory device 402 includes memory chips 404 on a substrate 406, where the memory chips 404 are enclosed in an encapsulant layer 408, but the memory device 402 does not include an active cooling device as shown in the memory device 300 in FIGS. 3A and 3B.

Instead, in this example, an active cooling device 409 is integrated in the PCB 400 adjacent to the memory device 402. The PCB 400 comprises a substrate 410 formed of a substrate material 412. The substrate 410 may comprise laminated layers 414(1)-414(L) and interconnects (not shown). The substrate 410 is positioned in FIG. 4A with an upper surface 418 on which the memory device 402 is disposed and a lower surface 420, opposite to the upper surface 418. The lower surface 420 comprises a package surface 422 of the substrate 410. At least one of the interconnects is coupled to the memory device 402 and may extend laterally and/or vertically to couple the memory device 402 to the processor module 206, to other memory devices 202(1)-202(M), or to the external interface 208 in FIG. 2. The active cooling device 409 is disposed between the lower surface 420 and the upper surface 418 of the substrate 410. The active cooling device 409 may be enclosed in a cavity 424 between the lower surface 420 and the upper surface 418. In such examples, the memory device 402 may be disposed on the upper surface 418 of the substrate 410, as shown in FIGS. 4A and 4B. In some examples, the cavity 424 may be open through the upper surface 418, with the active cooling device 409 disposed in the cavity 424. In such examples in which the active cooling device 409 is exposed, the memory device 402 may be directly or indirectly disposed on a surface of the active cooling device 409.

In the PCB 400, the active cooling device 409 moves heat from a first device surface 426 to a second device surface 428, where the heat can be dissipated from the lower surface 420 of the substrate 410. The first device surface 426 may be adjacent to the upper surface 418 of the substrate 410 or may be exposed. In either case, the first device surface 426 is adjacent to and thermally coupled to the memory device 402 and actively conducts heat away from the memory device 402 to the package surface 422. In some examples, a heat sink (not shown) may be coupled to the package surface 422 opposite the memory device 402 containing the heat generating memory chips 404, to conduct heat away from the package surface 422. In some examples, the substrate 410 may include a plurality of the active cooling devices 409 between the lower surface 420 and the upper surface 418 and adjacent to the plurality of memory devices 202(1)-202(M) disposed on the upper surface 418.

Figure 5:
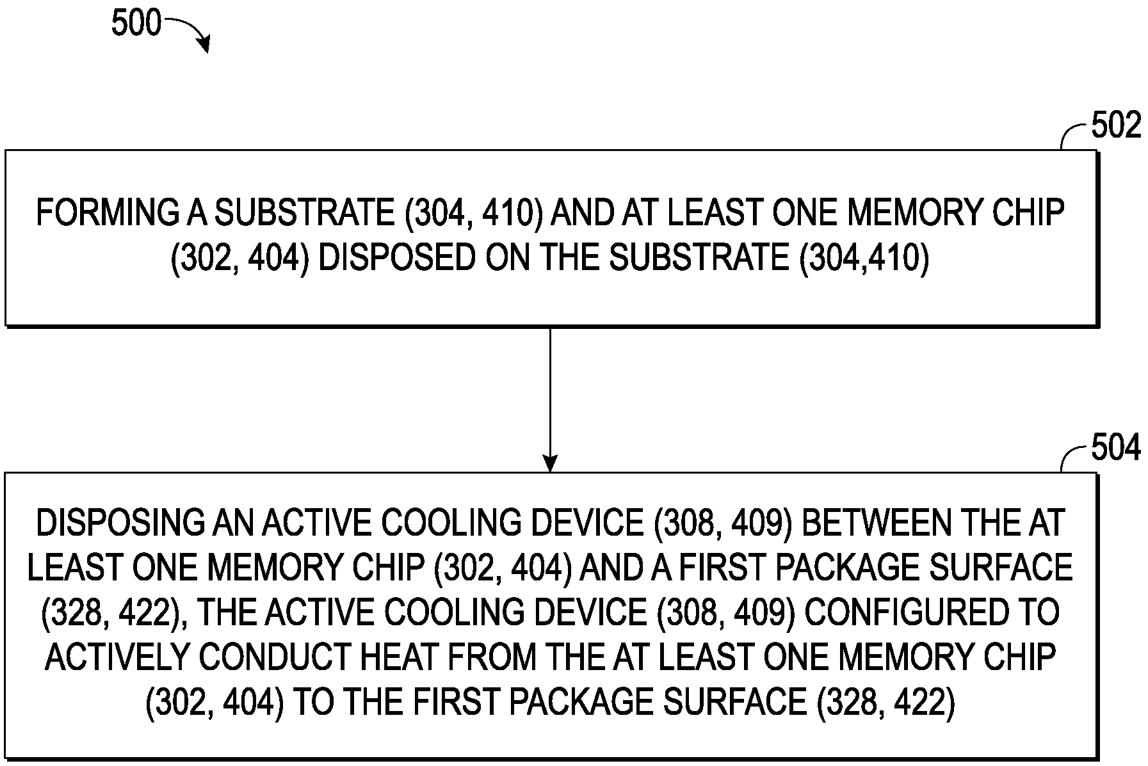
FIG. 5 is a flowchart of fabricating a memory device comprising the active cooling device as illustrated in any of FIGS. 3A-4B.

FIG. 5 is a flowchart of a method 500 of fabricating the memory packages 300 and 400. The method 500 includes forming a substrate 304, 410 and at least one memory chip 302, 404 disposed on the substrate 304, 410 (block 502). The method further includes disposing an active cooling device 308, 409 between the at least one memory chip 302, 404 and a first package surface 328, 422, the active cooling device 308, 409 configured to actively conduct heat from the at least one memory chip 302, 404 to the first package surface 328, 422 (block 504).

FIG. 6A is a plan view of a memory package 600 comprising memory devices 604 disposed on a PCB 606 wherein the memory devices 604 include memory chips 608 that are cooled by at least one active cooling device, as shown in FIGS. 6B and 6C. The memory package 600 does not include a processor module, as shown in FIG. 1, and may be a dual in-line memory device (DIMM). FIGS. 6B and 6C are cross-sectional side views of examples of the memory devices 604 and the PCB 606, respectively. The memory devices 604 include the memory chips 608 disposed on a substrate 610, an active cooling device 612 on one or more of the memory chips 608, and an encapsulant layer 614 enclosing the active cooling device 612 in a cavity 616. A first surface 618 of the active cooling device 612 is disposed on the memory chips 608 and is configured to actively conduct heat from the memory chips 608 to a first package surface 620 of the encapsulant layer 614. Each of the memory devices 604 may include an active cooling device 612.

In addition, the PCB 606 is also referred to as a substrate 624 with the memory devices 604 disposed on a first surface 626 of the substrate 624 and a second surface 628 opposite to the first surface 626, wherein the second surface 628 is also referred to as a second package surface 628. Alternatively, the substrate 624 may comprise a card or board of a type other than a PCB with the memory devices 604 disposed thereon. In this example, the PCB 606 includes a second active cooling device 630 disposed in a cavity 632 between the first surface 626 and the second surface 628. The second active cooling device 630 is configured to actively conduct heat from the memory device 604 disposed on the first surface 626 to the second package surface 628. In some examples, multiple memory devices 604 may be disposed adjacent to the second active cooling device 630 or there may be one second active cooling device 630 corresponding to each of the memory devices 604.

FIG. 7 is an exemplary computer system 700 that is one example of a computer processing system. The exemplary computer system 700 in this embodiment includes a processing device 702 or processor, a system memory 704, and a system bus 706. The processing device 702 represents one or more commercially available or proprietary general-purpose processing devices, such as a microprocessor, central processing unit (CPU), or the like. More particularly, the processing device 702 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 702 is configured to execute processing logic instructions for performing the operations and steps discussed herein.

In this regard, the various illustrative logical blocks, modules, and circuits described in connection with the embodiments disclosed herein may be implemented or performed with the processing device 702, which may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 702 may be a microprocessor, or may be any conventional processor, controller, microcontroller, or state machine. The processing device 702 may also be implemented as a combination of computing devices (e.g., a combination of a DSP and a microprocessor, a plurality of microprocessors, one or more microprocessors in conjunction with a DSP core, or any other such configuration).

The system memory 704 may comprise any of the memory packages 300, 400, or 600 as shown in FIGS. 3A, 3B, 4A, 4B, and 6A-6C, respectively, including active cooling devices. The system memory 704 including the memory device 701 may further include non-volatile memory 708 and volatile memory 710. The non-volatile memory 708 may include read-only memory (ROM), erasable programmable read-only memory (EPROM), electrically erasable programmable read-only memory (EEPROM), and the like. The volatile memory 710 generally includes RAM (e.g., DRAM, such as SDRAM). A basic input/output system (BIOS) 712 may be stored in the non-volatile memory 708 and can include the basic routines that help to transfer information between elements within the computer system 700.

The system bus 706 provides an interface for system components including, but not limited to, the system memory 704 and the processing device 702. The system bus 706 may be any of several types of bus structures that may further interconnect to a memory bus (with or without a memory controller), a peripheral bus, and/or a local bus using any of a variety of commercially available bus architectures.

The computer system 700 may further include or be coupled to a non-transitory computer-readable storage medium, such as a storage device 714, which may represent an internal or external hard disk drive (HDD), flash memory, or the like. The storage device 714 and other drives associated with computer-readable media and computer-usable media may provide non-volatile storage of data, data structures, computer-executable instructions, and the like. The storage device 714 may also be or include any of the memory packages 300, 400, or 600 as shown in FIGS. 3A, 3B, 4A, 4B, and 6A-6C, respectively, including active cooling devices. The computer system 700 may also include an input device interface 716, a communication interface 718, and a video port 720, for example.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A memory package comprising:

a substrate and at least one memory chip disposed on the substrate; and an active cooling device disposed between the at least one memory chip and a first package surface and configured to actively conduct heat from the at least one memory chip to the first package surface, wherein the active cooling device comprises a thermoelectric device configured to conduct the heat actively from a first device surface to a second device surface, wherein the first device surface of the active cooling device is disposed on a first side of the at least one memory chip, and the substrate is disposed on a second side of the at least one memory chip; and further comprising a printed circuit board (PCB), wherein:

the substrate comprises a first substrate of a memory device;

the PCB comprises a second substrate;

the first substrate of the memory device is coupled to a first surface of the second substrate; and the second substrate comprises a second active cooling device disposed within the PCB, between the first substrate and a second surface of the second substrate.

2. The memory package of claim 1, further comprising an encapsulant layer having a first side and a second side, wherein the second side comprises an exterior package surface of the memory package and wherein the first side is directly coupled to the substrate.

3. The memory package of claim 1, wherein the active cooling device is electrically coupled to the substrate.

4. The memory package of claim 1, wherein:

the active cooling device is disposed between the at least one memory chip and the first side of the encapsulant layer.

5. The memory package of claim 4, wherein the active cooling device is enclosed in a cavity between the encapsulant layer and the substrate.

6. The memory package of claim 5, wherein the second active cooling device is enclosed in the cavity between the encapsulant layer and the substrate.

7. The memory package of claim 1, wherein the at least one memory chip comprises a two-dimensional array of memory chips disposed on the substrate.

8. The memory package of claim 1, further comprising a dual in-line memory device.

9. A computer processing system comprising:

a processor circuit configured to process data; and the memory package of claim 1.

* * * * *